(12) United States Patent
Park et al.

(10) Patent No.: US 7,462,864 B2
(45) Date of Patent: Dec. 9, 2008

(54) THIN FILM TRANSISTOR AND MANUFACTURING METHOD THEREOF, AND LIQUID CRYSTAL DISPLAY DEVICE HAVING THIN FILM TRANSISTOR AND MANUFACTURING METHOD THEREOF

(75) Inventors: Mi Kyung Park, Anyang-si (KR); Gee Sung Chae, Inchon-si (KR)

(73) Assignee: LG Display Co., Ltd., Seoul (KR)

( * ) Notice: Subject to any disclaimer, the term of this patent is extended or adjusted under 35 U.S.C. 154(b) by 107 days.

(21) Appl. No.: 11/435,522

(22) Filed: May 17, 2006

(65) Prior Publication Data

US 2007/0145482 A1     Jun. 28, 2007

(30) Foreign Application Priority Data

Dec. 28, 2005    (KR)   ................ 10-2005-0131215

(51) Int. Cl.
*H01L 29/10*      (2006.01)

(52) U.S. Cl. .................................. 257/59; 257/E27.1
(58) Field of Classification Search ............. 257/59–67, 257/E27.1
See application file for complete search history.

(56) References Cited

U.S. PATENT DOCUMENTS

| 6,670,629 | B1 * | 12/2003 | Wilson ....................... 257/10 |
| 6,720,240 | B2 * | 4/2004 | Gole et al. ................... 438/487 |
| 2006/0110847 | A1 * | 5/2006 | Fujimori et al. ............... 438/99 |

\* cited by examiner

*Primary Examiner*—Richard A. Booth
(74) *Attorney, Agent, or Firm*—Brinks Hofer Gilson & Lione

(57) ABSTRACT

A liquid crystal display device includes a substrate, a gate line and a data line intersected with each other to define a pixel region on the substrate, a thin film transistor having a nanowire channel layer in an intersection region of the gate line and the data line, and a pixel electrode formed in the pixel region.

6 Claims, 4 Drawing Sheets

THIN FILM TRANSISTOR AND MANUFACTURING METHOD THEREOF, AND LIQUID CRYSTAL DISPLAY DEVICE HAVING THIN FILM TRANSISTOR AND MANUFACTURING METHOD THEREOF

TECHNICAL FIELD

The present disclosure relates to a method of manufacturing a thin film transistor, and more particularly, to a thin film transistor and a manufacturing method thereof, and a liquid crystal display device and a manufacturing method thereof, capable of improving production yield and contact reliability.

BACKGROUND

Generally, nanostructured materials have different physical and chemical properties than conventional materials. Nanostructured or nanosized materials have at least one dimension at the nanoscale ($10^{-9}$ m). Since their surface-to-mass ratio is great, such nanosized materials may be used in, for example, photocatalysis applications in which surface chemical reactions are important, or in optoelectric devices in which the optical properties are determined by surface defects, and so on.

Silicon carbide (SiC) nanorods and nanowires are cylindrical materials that have an extremely small diameter of, typically, several nanometers to several tens of nanometers and an aspect ratio of 10-10,000. The main component of the nanorods and nanowires is silicon carbide, which is a chemical compound of carbon and silicon. The nanorods and nanowires tend to be covered with a few nanometers to several tens of nanometers of amorphous silicon carbide, depending on the manufacturing methods. Since the SiC nanorods and nanowires have high strength, good chemical stability, and good electrical characteristics, they may be used in high-temperature and high-voltage environments. Field emission tips (FETs), for example, must maintain a stable field emission characteristic at a low vacuum and high temperature. In this regard, SiC nanorods and nanowires may be considered as next-generation field emission materials because they exhibit structural stability in an operating environment. Also, SiC nanorods and nanowires can be used as a reinforcing agent for increasing mechanical strength.

FIG. 1 is a sectional view of a related art nanowire thin film transistor.

Referring to FIG. 1, a gate metal is deposited on a substrate 10. Then, a gate electrode 1 is formed by exposing, developing and etching the gate metal according to a photolithography process. Thereafter, a $SiO_2$/Si insulation layer 3 is deposited on the substrate 10 where the gate electrode 1 is formed. A source/drain metal layer is deposited and etched to form source and drain electrodes 5a and 5b.

After the source and drain electrodes 5a are formed, silicon nanowires or carbon nanowires may be coated on the substrate 10 by dispersing them in an alcohol solvent, such as ethanol and IPA, and depositing the dispersion onto the substrate 10. In this manner, a thin film transistor having a nanowire 7 between the source and drain electrodes 5a and 5b may be manufactured.

However, the related art method of manufacturing a nanowire transistor has the following problems.

First, when nanowires are dispersed in an alcohol solvent and coated onto the substrate 10 such that a nanowire 7 is disposed between the source and drain electrodes 5a and 5b, the nanowire 7 may be incorrectly disposed between the source and drain electrodes 5a and 5b, thus decreasing the production yield.

When the nanowire 7 is a carbon nanotube (CNT), it is difficult to uniformly synthesize the nanowire and a Schottky resistance is great, resulting in the degradation of device performance.

In addition, when the nanowire 7 is a silicon nanowire, it is difficult to uniformly synthesize the silicon nanowire and its production yield is low. Consequently, it is difficult to apply the silicon nanowire to the manufacturing process.

SUMMARY

Accordingly, the present disclosure is directed to a thin film transistor and a manufacturing method thereof that may substantially obviate one or more problems due to limitations and disadvantages of the related art. The present disclosure also describes a liquid crystal display device and a manufacturing method thereof. The response speed and performance of the display device may be improved by using a nanowire thin film transistor as a switching element.

The present disclosure provides a thin film transistor that includes a gate electrode, a porous block disposed under the gate electrode, and source and drain electrodes formed on both sides of the porous block. The porous block includes a semiconducting material.

The present disclosure also provides a method of manufacturing a thin film transistor. A substrate is provided and a first metal layer is deposited on the substrate and etched to form a metal block layer. An insulation layer is formed on the metal block layer, and the metal block layer is etched to form a porous block and a drain electrode. A second metal layer is deposited on the substrate on which the porous block and the drain electrode are formed and etched to form a source electrode and a gate electrode. A plurality of nanowires are formed inside the porous block by using the source and drain electrodes as electrodeposition electrodes.

In a further aspect, the present disclosure provides a liquid crystal display device which includes a substrate, a gate line and a data line intersected with each other to define a pixel region on the substrate, a thin film transistor having a nanowire channel layer in an intersection region of the gate line and the data line, and a pixel electrode formed in the pixel region.

The present disclosure also provides a method of manufacturing a liquid crystal display device. A first metal layer is deposited on a substrate and etched to form a metal block layer, and an insulation layer is formed on the metal block layer. The metal block layer is etched to form a porous block and a drain electrode, and a second metal layer is deposited on the substrate on which the porous block and the drain electrode are formed and etched to form a source electrode. An insulation layer is formed on the substrate where the source electrode is formed, and a gate electrode is formed on the insulation layer. A plurality of nanowires are formed inside the porous block by using the source and drain electrodes as electrodeposition electrodes. A passivation layer is formed on the substrate where the nanowires are formed, and a contact hole is formed to expose a portion of the drain electrode. A transparent material layer is formed on the substrate where the contact hole is formed, and the transparent material layer is etched to form a pixel electrode.

It is to be understood that both the foregoing general description and the following detailed description are exemplary and explanatory and are intended to provide further explanation of the invention as claimed.

DETAILED DESCRIPTION

Reference will now be made in detail to the various embodiments, examples of which are illustrated in the accompanying drawings. Wherever possible, the same reference numbers will be used throughout the drawings to refer to the same or like parts.

FIGS. 2A to 2D are sectional views illustrating a method of manufacturing a nanowire TFT according to the present disclosure.

Figure 1:
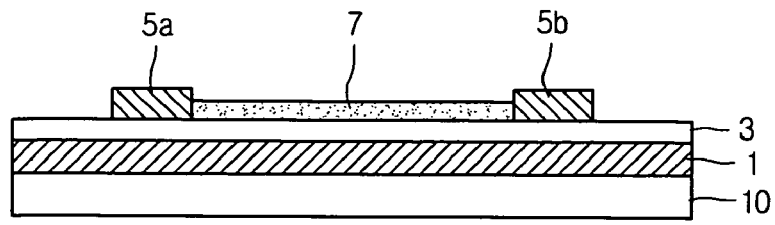
FIG. 1 is a sectional view of a related art nanowire TFT.
Figure 2A:
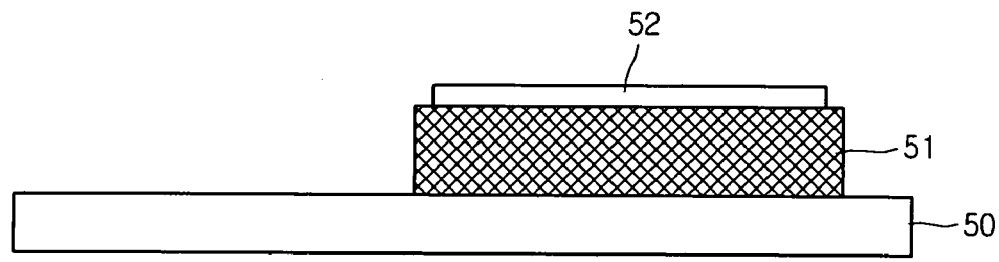
FIGS. 2A to 2D are sectional views illustrating a method of manufacturing a nanowire TFT according to the present disclosure.

Referring to FIG. 2A, a metal layer is formed on a transparent insulation substrate 50. Then, a metal block layer 51 is formed by exposing, developing and etching the metal layer according to a photolithography process. The metal block layer 51 may be formed of aluminum (Al), for example.

After the metal block layer 51 is formed on the insulation substrate 50, an insulation layer ($SiO_2$) 52 is formed on the metal block layer 51.

Figure 2B:
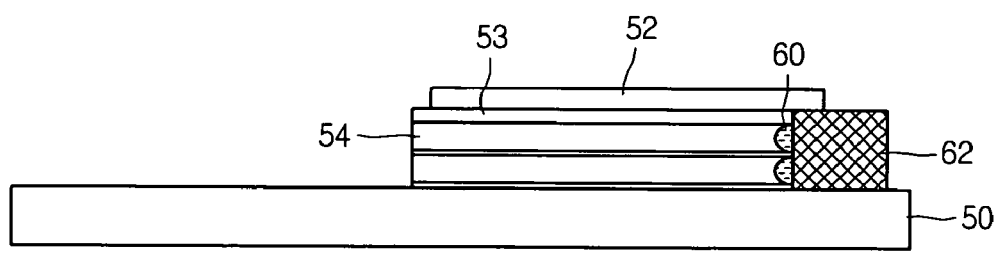

Referring to FIG. 2B, a porous block 53 and a drain electrode 62 are formed through two etching processes. At this point, a plurality of tunnels 54 are formed in the porous block 53.

The porous block 53 is formed by etching a portion of the metal block layer. The tunnels 54 inside the porous block 53 may be filled with nanowires in a later process.

A method of forming the tunnels 54 in the porous block 53 will now be described. A primary etching process is performed on one side of the metal block layer to form a plurality of grooves in the side of the metal block layer.

Then, a secondary etching process is performed on the one side of the metal block layer. At this point, the grooves formed by the primary etching process are etched at a fast speed compared with the other regions, and the tunnels 54 are formed.

$Al_2O_3$ is formed inside the tunnels 54 by an oxidation process, and the remaining metal block layer becomes the drain electrode 62.

After the tunnels 54 are formed in the porous block 53, a metal catalyst 60 for nanowire growth is formed on the drain electrode 62 inside the tunnels 54. Gold (Au), aluminum (Al), or nickel (Ni) may be used as the metal catalyst 60.

Figure 2C:
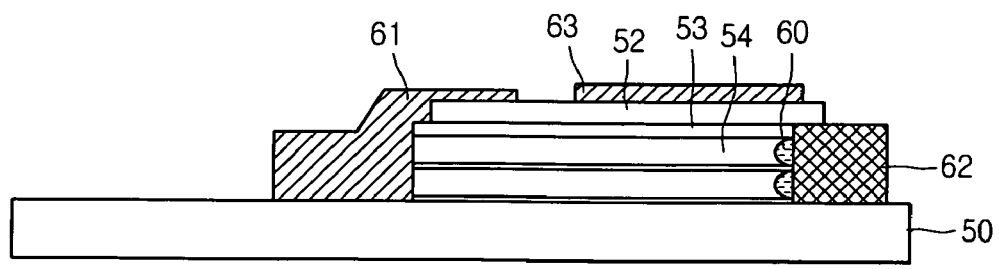

Referring to FIG. 2C, after the metal catalyst 60 is formed inside the tunnel 54, a metal layer is deposited on the insulation substrate 50 and etched to form a source electrode 61, which faces the drain electrode 62 at an entrance of the porous block 53. Then, a gate electrode 63 is formed on the insulation layer 52.

Figure 2D:
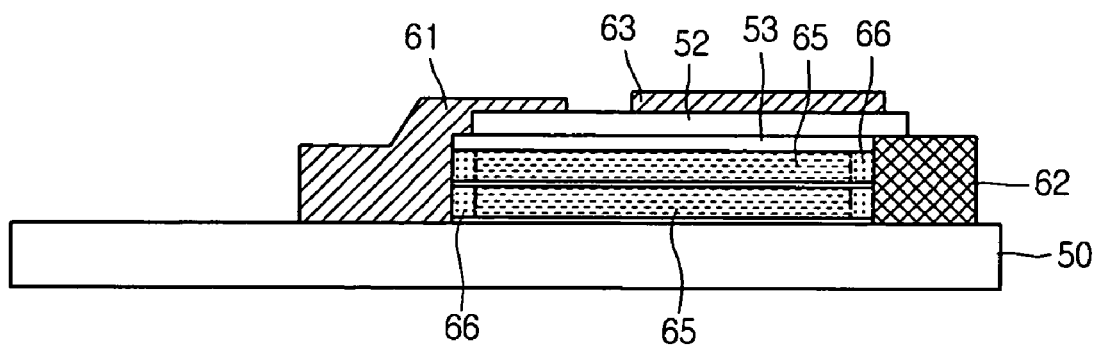

Referring to FIG. 2D, after the gate electrode 63 and the source electrode 61 are formed, the insulation substrate 50 is soaked in an electrolytic solution containing metal ions, such as $Zn^{2+}$, for an electrodeposition process. Using the source and drain electrodes 61 and 62 as electrodeposition electrodes, nanowires 65 (e.g., ZnO nanowires) are grown in the tunnels formed inside the porous block 53.

The nanowires 65 are grown at a fast speed within the tunnels due to the metal catalyst (60 in FIG. 2C). At this point, the nanowires 65 are electrically connected to the source and drain electrodes 61 and 62 at both ends of the tunnels. Using the characteristic that semiconducting materials having a bandgap of less than 4 eV can be used as a semiconductor device by applying a predetermined voltage, ZnO having an energy bandgap of about 3.2 eV, for example, may be used as a semiconductor device.

Examples of other possible materials include $TiO_2$ (energy bandgap: 3 eV), $WO_3$ (energy bandgap: 2.5 eV), and $SnO_2$ (energy bandgap: 3.5 eV). The nanowires may be formed of the exemplary materials, as well as of ZnO. Other semiconducting materials are also possible.

After the nanowires 65 are formed, a thermal treatment may be performed to cause an aluminum (Al) component of the source and drain electrodes 61 and 62 to diffuse. Consequently, an ohmic contact layer 66 may be formed between the nanowires 65 and the source and drain electrodes 61 and 62.

Since the nanowire TFT is formed by an electrodeposition process, the nanowires may be properly formed between the source and drain electrodes 61 and 62.

Also, since an ohmic contact layer may be formed between the grown nanowires and the electrodes, contact failure between the nanowires and the electrodes may be prevented.

Figure 3:
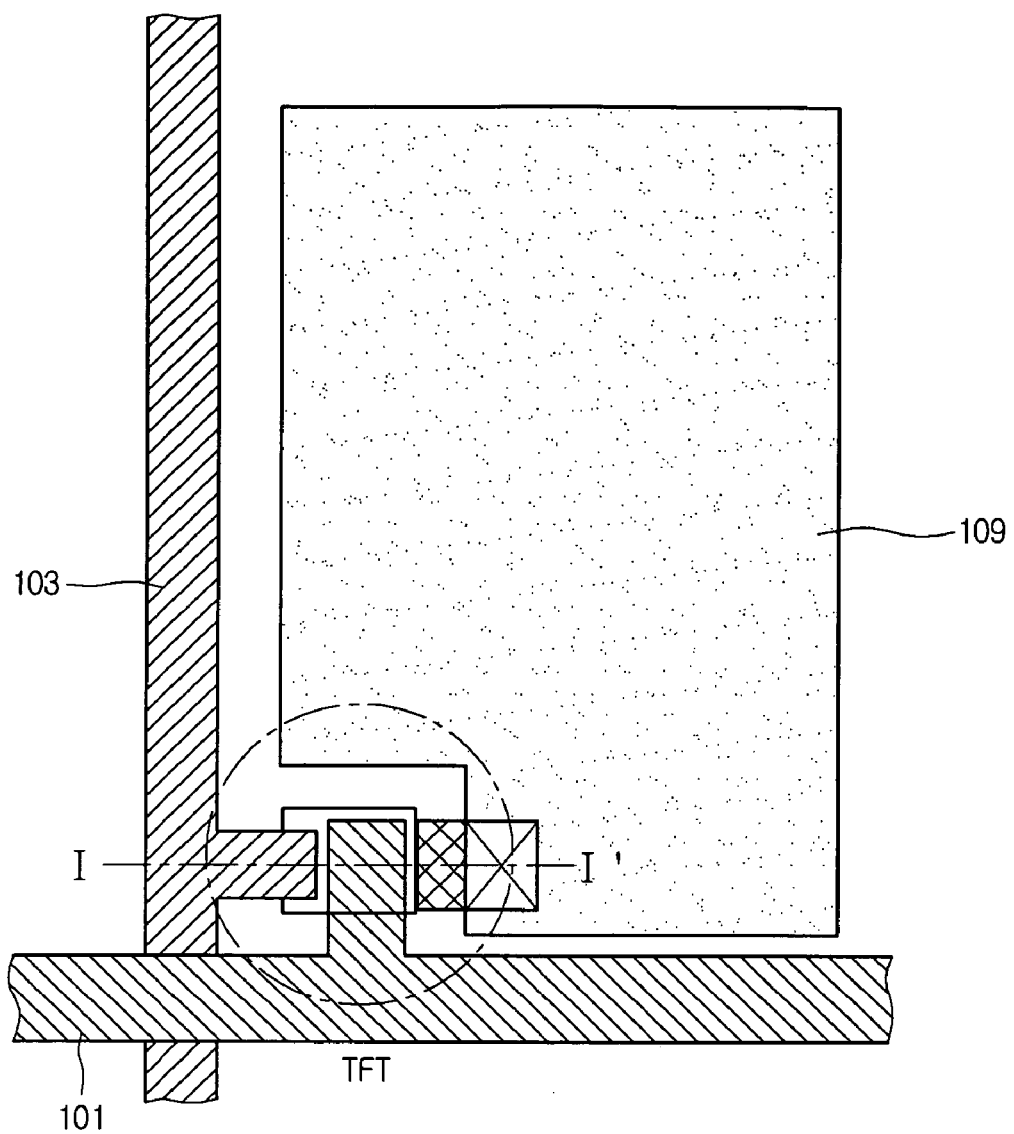
FIG. 3 is a plan view illustrating a pixel structure of an LCD with a nanowire TFT according to the present disclosure.

FIG. 3 is a plan view illustrating a pixel structure of an LCD with a nanowire TFT according to the present disclosure.

Referring to FIG. 3, a driving signal is applied through a gate line 101 and a data signal is applied through a data line 103. The gate line 101 and the data line 103 are intersected to define a unit pixel region. A TFT having a nanowire channel layer is disposed at the intersection region of the gate line 101 and the data line 103.

A pixel electrode 109 is formed in the pixel region. The pixel electrode 109 is electrically contacted with a drain electrode of the TFT in a direction parallel to the data line 103.

Since the nanowires may be properly connected to the source and drain electrodes, the TFT may have a faster response speed than an amorphous silicon transistor or a polysilicon transistor.

Figure 4:
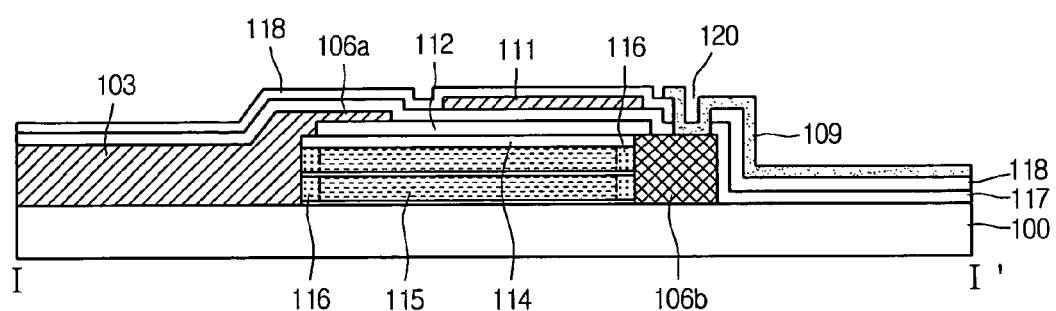
FIG. 4 is a sectional view taken along line I-I' of FIG. 3.

FIG. 4 is a sectional view taken along line I-I' of FIG. 3.

Referring to FIG. 4, a metal layer is formed on the insulation substrate 100. Then, the metal block layer is formed by exposing, developing and etching the metal layer according to a photolithography process. Thereafter, the insulation layer 112 is formed on the metal block layer. The metal layer may be formed of aluminum (Al), for example, and the insulation layer 112 may be formed of a $SiO_2$-based material, for example.

The porous block 114 and the drain electrode 106b are simultaneously formed according to the process that has been described above with reference to FIG. 2B.

At this point, a plurality of tunnels in which nanowires will be grown are formed in the porous block 114.

After the porous block 114 and the drain electrode 106b have been formed, a metal layer is deposited on the insulation substrate 100 and etched to form a source electrode 106a and a data line 103 at an end of the porous block 114.

After the source electrode 106a and the data line 103 are formed, an interlayer insulation layer 117 is formed on the insulation substrate 100 and a metal layer is then deposited and etched to form a gate electrode 111 and a gate line on the insulation layer 112 where the porous block 114 is formed.

As described above with reference to FIGS. 2C and 2D, after the gate electrode 111 is formed, the insulation substrate 100 is soaked in an electrolytic solution containing metal ions, for example, $Zn^{2+}$, by using the source and drain electrodes 61 and 62. In this manner, nanowires 115 (e.g., ZnO nanowires) may be formed in the tunnels formed inside the porous block 114.

The nanowires 115 may fill the tunnels at a fast speed by means of the metal catalyst. The nanowires are electrically connected to the source and drain electrodes 106a and 106b.

After the nanowires 115 are formed, a thermal treatment is performed to cause an aluminum (Al) component of the source and drain electrodes 106a and 106b to diffuse, thus forming an ohmic contact layer 116 between the nanowires 115 and the source and drain electrodes 106a and 106b.

Then, a passivation layer 118 is formed on the insulation substrate 100 and a contact hole 120 is formed to expose a portion of the drain electrode 106b.

After the contact hole 120 is formed on the insulation substrate 100, a transparent material layer is deposited and etched to form a pixel electrode 109, one side of which is electrically contacted with the drain electrode 106b.

By forming the TFT with the nanowire channel layer, the response speed and production yield of the LCD may be improved.

As described above, the contact resistance problem of the TFT may be solved or mitigated by electrodeposition of the nanowires using the source and drain electrodes.

In addition, the response speed and performance of the LCD may be improved by using the TFT with the nanowires as the switching element.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A liquid crystal display device comprising:
    a substrate;
    a metal block layer having a porous block and a drain electrode on the substrate, the porous block having a plurality of tunnels;
    an insulation layer on the metal block layer;
    a source electrode and a data line at an end of the porous block;
    an interlayer insulation layer on the source electrode, the data line and the insulation layer;
    a gate electrode and a gate line on the interlayer insulation layer, the gate electrode being formed on the interlayer insulation layer between the source electrode and the drain electrode, and the gate line and the data line being intersected with each other to define a pixel region;
    nanowires formed in the tunnels of the porous block to form a nanowire channel layer, the nanowires being electrically connected to the first and second electrodes at ends of the tunnels;
    ohmic contact layers formed between the nanowires and first electrode and between the nanowires and the second electrode;
    a passivation layer on the substrate including the gate electrode and the gate line; and
    a pixel electrode formed to connect the drain electrode in the pixel region,
    wherein the gate electrode, the nanowire channel layer, the ohmic contact layers, the source electrode and the drain electrode constitute a thin film transistor.

2. The liquid crystal display device according to claim 1, wherein the nanowire is formed of a material selected from the group consisting of ZnO, $TiO_2$, $WO_3$, and $SnO_2$.

3. The liquid crystal display device according to claim 1, wherein the nanowire channel layer is formed in the porous block disposed between source and drain electrodes of the thin film transistor.

4. The liquid crystal display device according to claim 1, wherein the pixel electrode is disposed parallel to the data line.

5. The liquid crystal display device according to claim 1, wherein the pixel electrode electrically contacts a drain electrode of the thin film transistor.

6. The liquid crystal display device according to claim 1, further comprising an ohmic contact layer in a region where the nanowire channel layer contacts source and drain electrodes of the thin film transistor.

* * * * *